US012738455B2

(12) United States Patent
Coumou et al.

(10) Patent No.: US 12,738,455 B2
(45) Date of Patent: Sep. 15, 2026

(54) RF POWER SPLITTING AND CONTROL

(71) Applicant: Applied Materials, Inc., Santa Clara, CA (US)

(72) Inventors: David Coumou, Webster, NY (US); Dennis Brown, Pittsford, NY (US); Jacob Harrell, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 70 days.

(21) Appl. No.: 18/596,491

(22) Filed: Mar. 5, 2024

(65) Prior Publication Data

US 2025/0285840 A1 Sep. 11, 2025

(51) Int. Cl.
*H01J 37/32* (2006.01)
*H01P 5/16* (2006.01)
*H03H 7/38* (2006.01)

(52) U.S. Cl.
CPC .......... *H01J 37/32183* (2013.01); *H01P 5/16* (2013.01); *H03H 7/38* (2013.01)

(58) Field of Classification Search
None
See application file for complete search history.

(56) References Cited

U.S. PATENT DOCUMENTS 5,629,653 A * 5/1997 Stimson ............ H01J 37/32183 333/99 PL
7,109,788 B2 * 9/2006 Jevtic ................ H01J 37/32082 329/346
7,503,996 B2 * 3/2009 Chen ................. H01J 37/32174 118/723 VE
7,811,410 B2 * 10/2010 Leming .................. H03B 21/00 118/723 VE
8,044,594 B2 * 10/2011 Morgan ............ H01J 37/32944 315/111.21
8,055,203 B2 * 11/2011 Choueiry .......... H01J 37/32935 455/67.11
8,190,380 B2 * 5/2012 Choueiry .......... H01J 37/32935 455/67.11
8,395,078 B2 * 3/2013 Ilic ....................... B23K 10/006 204/192.12

(Continued)

FOREIGN PATENT DOCUMENTS

WO 2018111598 A1 6/2018
WO 2019139395 A1 7/2019

OTHER PUBLICATIONS

International Search Report and Written Opinion from PCT/US2025/014598 dated May 28, 2025, 10 pgs.

*Primary Examiner* — Srinivas Sathiraju
(74) *Attorney, Agent, or Firm* — Schwabe, Williamson & Wyatt, P.C.

(57) ABSTRACT

Embodiments disclosed herein include an apparatus that includes a radio frequency (RF) power supply, and a power splitter electrically coupled to the RF power supply. In an embodiment, the apparatus includes a plurality of impedance matches electrically coupled to the power splitter, where the power splitter is configured to split RF power from the RF power supply in order to supply the RF power to each of the plurality of impedance matches. In an embodiment, the apparatus further includes a plurality of chambers, wherein each chamber is electrically coupled to a different one of the plurality of impedance matches.

20 Claims, 9 Drawing Sheets

(56) References Cited

U.S. PATENT DOCUMENTS 8,542,471 B2* 9/2013 Bulliard .............. H01J 37/3444 361/79
8,552,665 B2* 10/2013 Larson ..................... H05H 1/46 315/307
8,803,424 B2* 8/2014 Boston .............. H01J 37/32183 315/111.21
8,837,100 B2* 9/2014 Bulliard .............. H01J 37/3444 361/79
8,854,781 B2* 10/2014 Bulliard ................... H02H 1/06 361/79
8,884,180 B2* 11/2014 Ilic ....................... B23K 10/006 204/192.12
9,130,536 B2* 9/2015 Lane ......................... H01P 5/12
9,214,801 B2* 12/2015 Bulliard .............. H01J 37/3444
9,337,000 B2* 5/2016 Marakhtanov .... H01J 37/32183
9,997,903 B2* 6/2018 Bulliard .............. H01J 37/3444
10,916,411 B2* 2/2021 Shinagawa ....... H01J 37/32972
11,881,381 B2* 1/2024 Kapoor ............. H01J 37/32091
11,984,298 B2* 5/2024 Juco .................. H01J 37/32183
11,994,542 B2* 5/2024 Kapoor .............. G01R 19/2509
12,051,630 B2* 7/2024 Kapoor ............. H01J 37/32155
12,136,938 B2* 11/2024 Juco .................. H01J 37/32183
12,322,582 B2* 6/2025 Kapoor ............. H01J 37/32944
2012/0013352 A1* 1/2012 Choueiry .......... H01J 37/32935 324/629
2012/0098575 A1* 4/2012 Boston .............. H01J 37/32183 327/104
2013/0052365 A1* 2/2013 Liu ..................... C23C 16/4401 427/527
2015/0028962 A1* 1/2015 Lane ...................... H03H 7/422 333/124
2015/0091440 A1* 4/2015 Marakhtanov .... H01J 37/32183 315/111.21
2017/0099782 A1* 4/2017 Wolfe .................... B65G 27/12
2017/0103870 A1* 4/2017 Marakhtanov .... H01J 37/32091
2017/0117869 A1* 4/2017 Leeser .............. H01J 37/32183
2017/0278686 A1* 9/2017 Brcka ................... C23C 14/345
2018/0053633 A1* 2/2018 Glazek ................ H01J 37/3299
2018/0175819 A1* 6/2018 Rangineni ......... C23C 16/45536
2018/0309424 A1* 10/2018 Leeser ..................... H03H 7/38
2018/0358205 A1* 12/2018 Long .................. H01J 37/3244
2019/0068158 A1* 2/2019 Coumou .................. H03H 7/48
2020/0051787 A1* 2/2020 Shinagawa ....... H01J 37/32183
2020/0126761 A1* 4/2020 Coumou .................. H03H 7/38
2020/0154643 A1* 5/2020 Wolfe .................... B65G 27/12
2020/0244244 A1* 7/2020 Leeser .............. H01J 37/32183
2020/0343075 A1* 10/2020 Kim .................. H01J 37/32091
2021/0313948 A1* 10/2021 Leeser .............. H01J 37/32183
2021/0320683 A1* 10/2021 Seong .................... H04B 1/401
2022/0037135 A1* 2/2022 Kapoor ............. H01J 37/32944
2022/0406565 A1* 12/2022 Chen ................. H01J 37/32091
2023/0207266 A1* 6/2023 Gu .................... H01J 37/32174 315/111.21
2023/0246624 A1* 8/2023 Rangineni ......... C23C 16/45536
2023/0360885 A1* 11/2023 Coumou ........... H01J 37/32183
2024/0094273 A1* 3/2024 Guo .................. H01J 37/32183
2024/0120178 A1* 4/2024 Guo ......................... H03H 7/40
2024/0355600 A1* 10/2024 Kapoor ............. H01J 37/32944
2025/0285840 A1* 9/2025 Coumou .................. H03H 7/38
2026/0045466 A1* 2/2026 Coumou ............. H01J 37/3299

* cited by examiner 430
434
431
432
433A
433B 430
434
431
432
433

430
434
431
432
433A
433B

RF POWER SPLITTING AND CONTROL

BACKGROUND

1) Field

Embodiments relate to the field of semiconductor manufacturing and, in particular, to RF power splitting and control.

2) Description of Related Art

Plasma processing tools are used throughout the manufacturing process of semiconductor devices. For example, plasma processing tools may be used in deposition process, etching process, and/or treatment processes. A common form of plasma processing tool is a radio frequency (RF) plasma processing tool. In an RF plasma processing tool, a power generator is provided to generate the RF power. The RF power is delivered to a chamber so that the RF power can be coupled to processing gasses in order to ignite and/or sustain a plasma within the chamber.

Impedance matching is used to provide more efficient operation. For example, an impedance match is often provided between the power generator and the chamber in order to match the plasma load impedance to the characteristic impedance of the system. The impedance match may be a variable impedance match in order to account for changing plasma load impedances within the chamber (as a result of, for example, process variable changes during a process recipe).

In a one-to-one system (i.e., a system with a single power generator that is coupled to a single chamber), the control of the variable impedance match is relatively straight forward. However, as multiple chambers are coupled to a single power generator, the control of the system becomes more complex.

SUMMARY

Embodiments disclosed herein include an apparatus that includes a radio frequency (RF) power supply, and a power splitter electrically coupled to the RF power supply. In an embodiment, the apparatus includes a plurality of impedance matches electrically coupled to the power splitter, where the power splitter is configured to split RF power from the RF power supply in order to supply the RF power to each of the plurality of impedance matches. In an embodiment, the apparatus further includes a plurality of chambers, wherein each chamber is electrically coupled to a different one of the plurality of impedance matches.

Embodiments disclosed herein may also include an apparatus with a radio frequency (RF) power generator and a power splitter coupled to the RF power generator. In an embodiment, the apparatus further includes a plurality of impedance matches, where each of the plurality of impedance matches is coupled to the RF power generator, and where the power splitter is configured to split RF power from the RF power generator to supply RF power to each of the plurality of impedance matches. In an embodiment, each of the plurality of impedance matches includes an actuator configured to alter an impedance of a respective impedance match. In an embodiment, the apparatus further includes a plurality of reflected power sensors, where each of the plurality of reflected power sensors is electrically coupled between the power splitter and a different one of the plurality of impedance matches. In an embodiment, the apparatus further includes a controller, where the controller is configured to receive an input signal from each of the plurality of reflected power sensors and use the input signal to drive the actuators in order to alter the impedance of the respective impedance match.

Embodiments may also include an apparatus for controlling a plurality of impedance matches that includes coupling circuitry and analog control circuitry configured to receive incident and reflected radio frequency (RF) voltages and RF current signals from a plurality of sensors, and an RF control platform. In an embodiment, the RF control platform includes programmable logic, a real time processing unit (RTPU), a message controller, and a processor. In an embodiment, the apparatus further includes a plurality of motor control interfaces, where the plurality of motor control interfaces are configured to control impedances of the plurality of impedance matches.

DETAILED DESCRIPTION

Figure 1A:
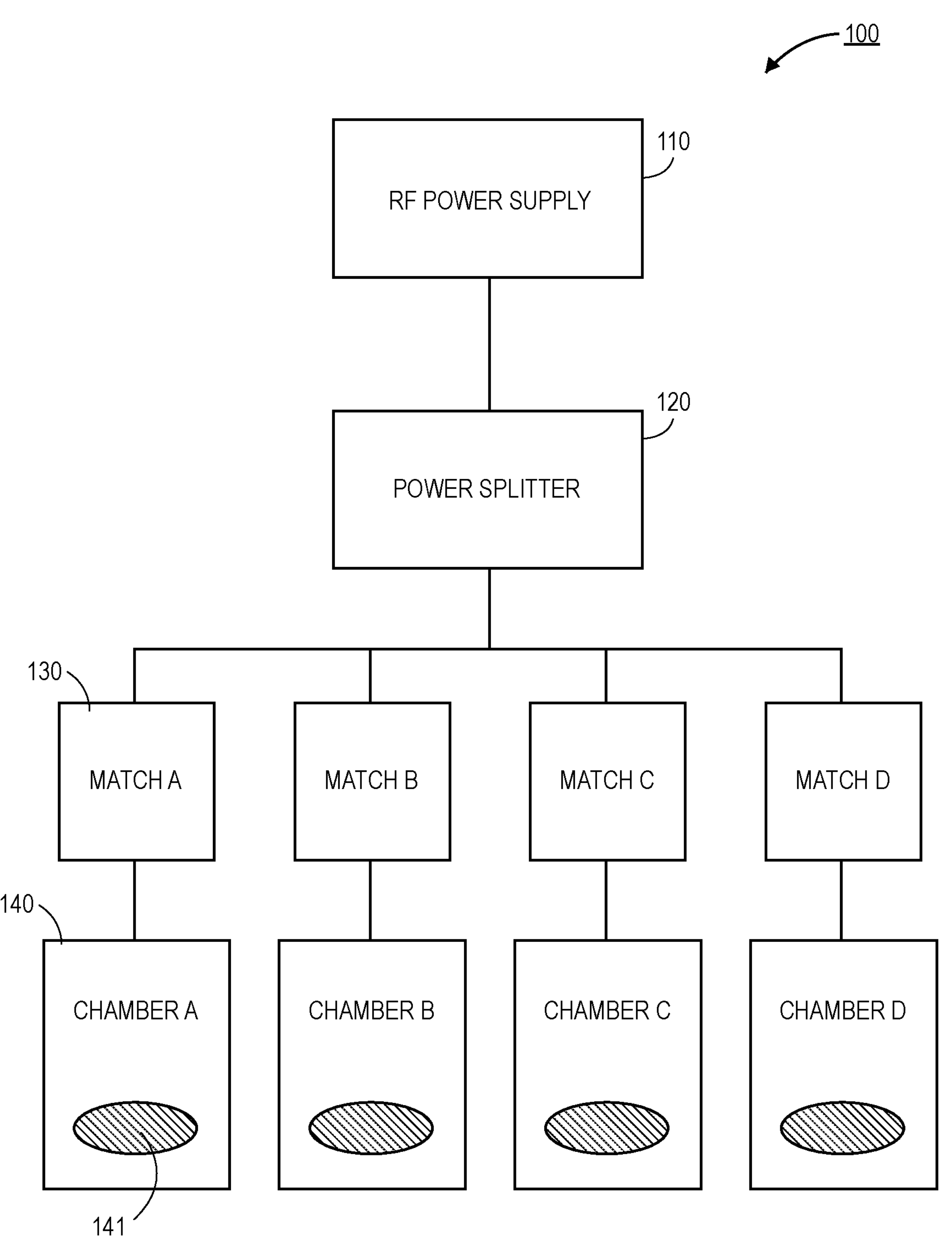
FIG. 1A is schematic illustration of a plasma processing tool that comprises a single RF power supply that is coupled to a plurality of chambers, where the RF power is split by a power splitter and each chamber has its own variable impedance match, in accordance with an embodiment.

Embodiments described herein include apparatuses and methods for RF power splitting and control. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

Various embodiments or aspects of the disclosure are described herein. In some implementations, the different embodiments are practiced separately. However, embodiments are not limited to embodiments being practiced in isolation. For example, two or more different embodiments can be combined together in order to be practiced as a single device, process, structure, or the like. The entirety of various embodiments can be combined together in some instances. In other instances, portions of a first embodiment can be combined with portions of one or more different embodiments. For example, a portion of a first embodiment can be combined with a portion of a second embodiment, or a portion of a first embodiment can be combined with a portion of a second embodiment and a portion of a third embodiment.

The embodiments illustrated and discussed in relation to the figures included herein are provided for the purpose of explaining some of the basic principles of the disclosure. However, the scope of this disclosure covers all related, potential, and/or possible, embodiments, even those differing from the idealized and/or illustrative examples presented. This disclosure covers even those embodiments which incorporate and/or utilize modern, future, and/or as of the time of this writing unknown, components, devices, systems, etc., as replacements for the functionally equivalent, analogous, and/or similar, components, devices, systems, etc., used in the embodiments illustrated and/or discussed herein for the purpose of explanation, illustration, and example.

As noted above, coupling a single RF power distribution system with a plurality of chambers results in the need for a significantly more complex control scheme. Typically, the impedance match is provided between the RF generator and the power splitter. One significant issue with such a design is that cross-talk between chambers becomes hard to manage. For example, the individual chambers may each have different plasma load impedances. When the splitter is downstream of the match, a change in the load condition or transient will infringe on the voltage and current flow through the splitter network and create a secondary transient for impedance and power balancing.

Accordingly, embodiments disclosed herein may include an RF power distribution system that comprises a power splitter that is provided upstream of a plurality of impedance matches (e.g., at least one impedance match for each chamber). That is, the portion of the power distribution system upstream of the power splitter is a fixed impedance system. Such an architecture can provide multiple benefits.

One benefit is that voltage and current handling is improved. For a characteristic impedance, the power splitting can be optimized for transmitting lower voltages and/or currents compared to architectures where the impedance match is between the RF generator and the power splitter. Further, power distribution with an optimized characteristic impedance is significantly less complex. This yields a lower cost and enables reliable process power distribution. The RF stress on the system is also decreased.

Complexity may be reduced due to the improved isolation provided by embodiments described herein. As used herein, "isolation" may refer to the immunity of one branch of the splitting system from impairing the performance of another branch. As described above, the existing architecture has little (or no) protection for such cross-talk. In embodiments disclosed herein, the improved isolation allows for the reduction (or elimination) of secondary transients, which makes impedance matching and power balancing less complicated. For example, transient effects may be reduced by potentially orders of magnitude.

The complexity is also reduced through improvements in impedance matching control. For example, each impedance match in the RF power distribution system may include its own actuators in order to modify the impedance. In combination with a dedicated sensor for each impedance match, the control system can monitor reflected power and make adjustments to one or more variable passive devices (e.g., a capacitor) in order to improve the impedance matching along a single branch of the RF power distribution system.

Improved ability to scale systems is also enabled by embodiments disclosed herein. For example, scaling can include adding additional RF generators at different RF power levels. When adding multiple RF generators, the power splitter to multiple impedance matches architecture has superior isolation compared to existing solutions. For example, isolation may be greater than several orders of magnitude of a second RF generator impairing the first RF generator.

RF distribution systems that have a single splitter that feeds a plurality of impedance matches may be useful in multiple application spaces. In one embodiment, distributed process chambers on a single mainframe with independent vacuum systems for single substrate processing may benefit from the use of the RF distribution systems described herein. Similarly, distributed process chambers on a single mainframe that have a common vacuum system for batch substrate processing may benefit from the use of the RF distribution systems described herein.

Referring now to FIG. 1A, a schematic illustration of an RF plasma processing tool 100 is shown, in accordance with an embodiment. In an embodiment, the RF plasma processing tool 100 may be a multi-chamber 140 tool. The RF plasma processing tool 100 may be any type of RF plasma processing tool, such as a plasma enhanced atomic layer deposition (PEALD) tool, a plasma enhanced chemical vapor deposition (PECVD) tool, a physical vapor deposition (PVD) tool, a plasma etching tool, a plasma treatment tool, or the like. In FIG. 1A, chambers 140 include four chambers (e.g., Chamber A to Chamber D). Though, it is to be appreciated that embodiments may include an RF plasma processing tool 100 with two or more chambers 140. The chambers 140 may be part of a single mainframe or cluster tool. Though, in other embodiments, the chambers 140 may be part of separate systems.

In an embodiment, the chambers 140 may each comprise their own vacuum systems for single substrate 141 processing. The substrates 141 may include any type of substrate 141 that is processed with a plasma. For example, the substrate 141 may be a semiconductor substrate, such as a silicon wafer or the like. The substrate 141 may have a standard form factor (e.g., 300 mm wafer, 450 mm wafer, etc.). In other embodiments, substrate 141 may be a dielectric substrate, a ceramic substrate, a glass substrate, or the like. Such substrate 141 may have panel, half-panel, quarter-panel, etc. form factors which may be common for plasma processing of such substrates.

In an embodiment, an RF power distribution system may supply RF power to each of the chambers 140. The RF power may be coupled to one or more gasses provided within the chambers 140 in order to ignite and/or sustain an RF plasma used to process the substrates 141. In an embodiment, the RF power distribution system may include a multiple branch configuration, with each branch being coupled to one of the chambers 140.

In an embodiment, the RF power distribution system may comprise an RF generator 110. RF generators 110 may also be referred to as an RF power supply in other embodiments. The RF generator 110 may be configured to provide RF signals at a particular frequency and with a desired power. In some embodiments the power can be modulated. The frequency and power levels may be chosen based on the desired process outcomes within the chambers 140. In an embodiment, the frequency may be 13.56 MHz, though other frequencies may also be used. In yet another embodiment, the frequency of the RF power generator 110 may also be variable in order to provide frequency tuning.

In the illustrated embodiment, a single RF generator 110 is shown. However, embodiments may also include multiple RF generators 110 in order to provide different RF powers into the RF power distribution system. As will be described in greater detail below, the isolation benefits of the architectures described herein may allow for improved isolation (e.g., at least several orders of magnitude) between a first RF generator 110 and a second RF generator 110.

In an embodiment, the RF power distribution system may also comprise a power splitter 120. The power splitter 120 may have a single input to receive RF power from the RF generator 110 (e.g., along a coaxial cable) and a plurality of outputs to feed RF power to the plurality of chambers 140. In the illustrated embodiment, a single output line extends out of the power splitter 120, and that single line is then branched. This illustration is done in an effort to simplify the illustration in FIG. 1A. In a more realistic view, the "splitting" of the RF power is done within the power splitter 120, and a plurality of output lines will exit the power splitter 120.

In an embodiment, any suitable RF power splitting architecture may be used as the power splitter 120. In an embodiment, the power splitter 120 may be a high isolation splitter or a low isolation splitter. The low isolation splitter may have less complexity and undergo less RF stress. The high isolation splitter may have a more complex circuitry, with the benefit of providing better isolation between branches of the RF power distribution system, compared to the low isolation splitter. A more detailed explanation of the power splitter 120 is provided in greater detail below.

In an embodiment, the power splitter 120 may be configured to evenly distribute the RF power to each of the branches within the RF power distribution system. For example, all of the chambers 140 may receive substantially the same amount of RF power. In other embodiments, the power splitter 120 may be configured to provide unequal RF power distribution. In an embodiment, the unequal RF power distribution may be suitable for when chambers 140 are running different process recipes or the like. The power splitter 120 may be fixed, so that the distribution of power between each branch of the RF power distribution system is constant. In other embodiments, the power splitter 120 may have controls in order to adjust the percentage of the RF power delivered to any of the branches in the RF power distribution system. In an embodiment, the portion of the power distribution system upstream of the power splitter 120 is a fixed impedance system. As described above, the use of a fixed impedance system allows for improved voltage and current handling and reduced complexity in the system. Fixed impedances may also avoid standing waves in distribution cables, and optimizes for efficiency and power delivery. Though, other embodiments may include a variable impedance system upstream of the power splitter 120. For example, an RF generator with a PIN diode may be provided upstream of the power splitter 120.

In an embodiment, the RF power distribution system may further comprise a plurality of impedance matches 130. As shown, in FIG. 1A a set of four impedance matches 130 (e.g., Match A to Match D) are provided in order to provide a one-to-one ratio of impedance matches 130 to chambers 140. Though, as will be described in greater detail below, the number of impedance matches 130 may be different than the number of chambers 140.

In an embodiment, each of the impedance matches 130 may be electrically coupled between the power splitter 120 and the respective chamber 140 to which the impedance match 130 is connected. The interconnects between the power splitter 120 and the impedance matches 130 may comprise coaxial cables. Similarly, the impedance matches 130 may be connected to the chambers 140 by coaxial cabling or the like. As used herein, each "branch" of the RF power distribution system may refer to the interconnect from the power splitter 120 to the impedance match 130, the impedance match 130, and the interconnect (if present) between the impedance match 130 and the chamber 140. The chamber 140 may be considered as part of the branch in some instances, though inclusion of the chamber 140 as part of the branch is not necessary.

In an embodiment, the impedance matches 130 may comprise any suitable matching circuitry. For example, the impedance matches 130 may comprise a pi network match, an L network match, an inverted L network match, a two stage L network match, or the like. The impedance matches 130 may be variable impedance matches 130 in order to adjust the impedance in order to account for changes in the plasma load impedance within the chamber 140. The impedance matches 130 may, therefore, include one or more actuators for actuating passive components (e.g., capacitors or inductors) in order to achieve the desired impedance. The impedance matches 130 may be controlled by a controller (not shown) that receives sensor data from the RF power distribution system in order to calculate the necessary changes that should be made to the impedance matches 130.

Figure 1B:
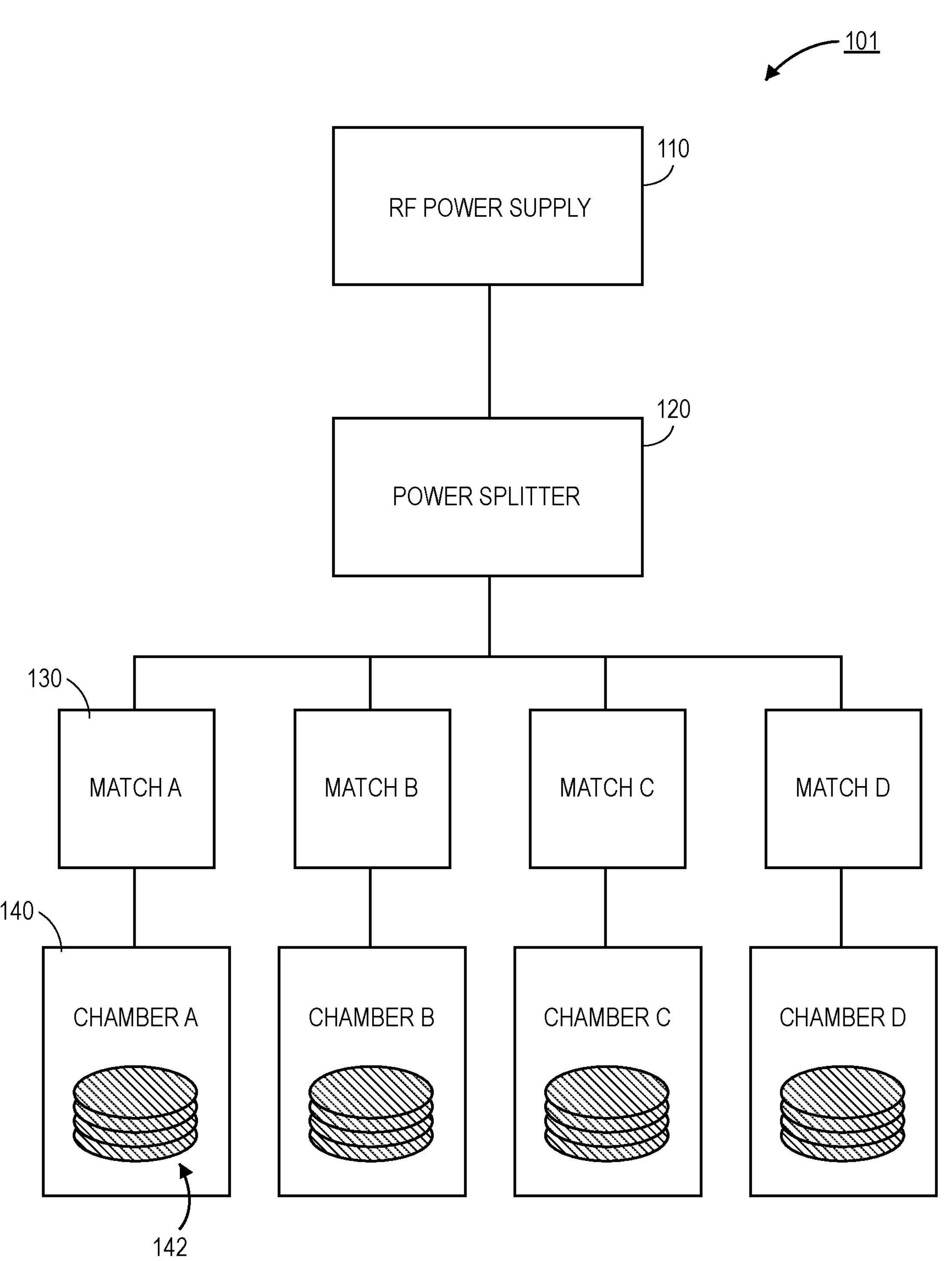
FIG. 1B is a schematic illustration of a plasma processing tool that comprises a single RF power supply that is coupled to a plurality of chambers for batch processing substrates, where the RF power is split by a power splitter and each chamber has its own variable impedance match, in accordance with an embodiment.

Referring now to FIG. 1B, a schematic illustration of an RF plasma processing tool 101 is shown, in accordance with an embodiment. In an embodiment, the RF plasma processing tool 101 in FIG. 1B may be similar to the RF plasma processing tool 100 in FIG. 1A, with the exception of the chambers 140 that are coupled to the RF power distribution system. Instead of having independent vacuum systems, the chambers 140 may be distributed process chambers on a single mainframe (not shown) that have a common vacuum system. This allows for easier batch substrate 142 processing. As shown in each chamber 140, a batch 142 (e.g., two or more substrates 141) may be processed at the same time, or at nearly the same time.

Figure 1C:
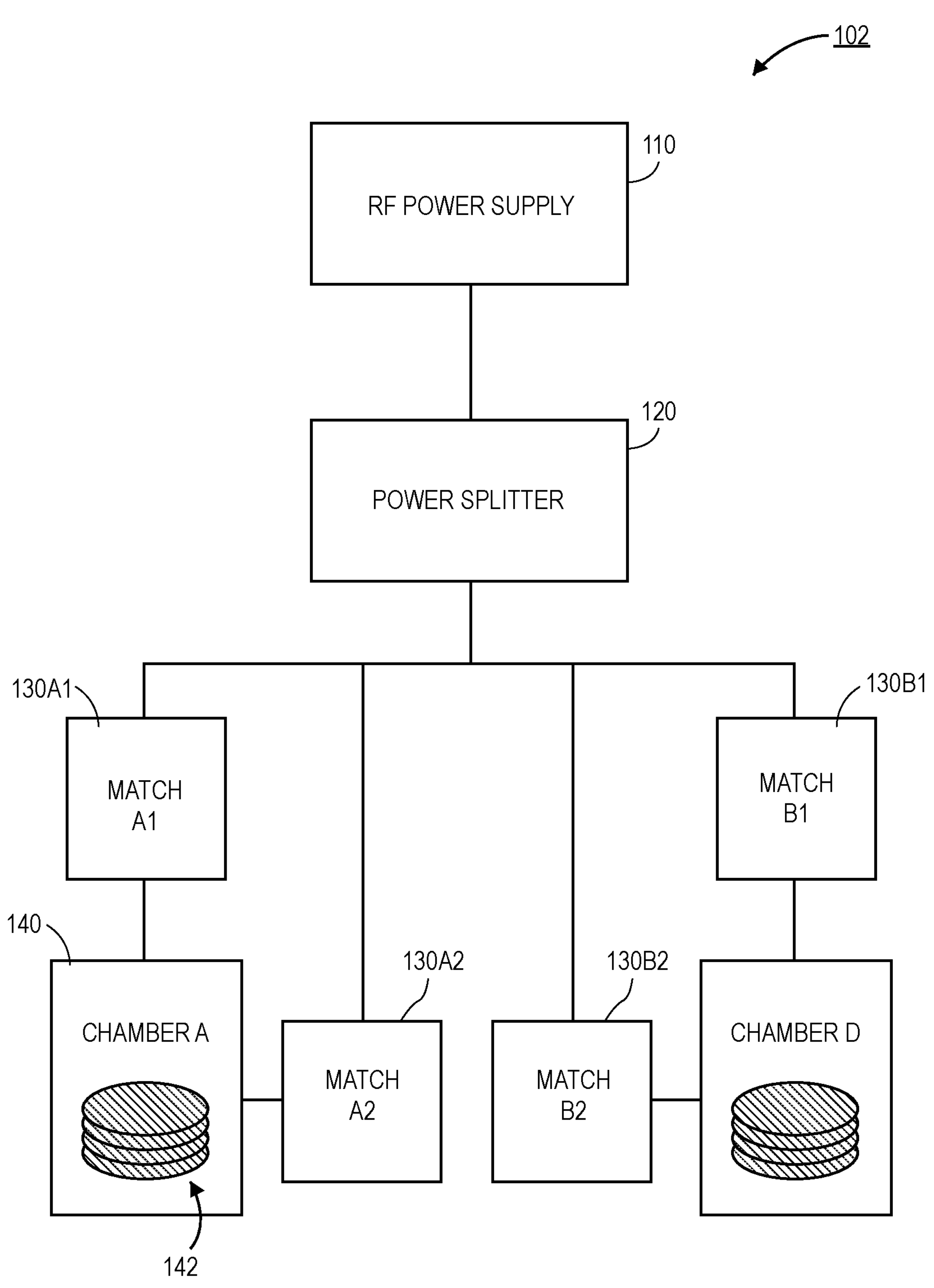
FIG. 1C is a schematic illustration of a plasma processing tool that comprises a single RF power supply that is coupled to a plurality of chambers, where the RF power is split by a power splitter and each chamber comprises a plurality of variable impedance matches, in accordance with an embodiment.

Referring now to FIG. 1C, a schematic illustration of an RF plasma processing tool 102 is shown, in accordance with an embodiment. In an embodiment, the RF plasma processing tool 102 in FIG. 1B may be similar to the RF plasma processing tool 101 in FIG. 1B, with the exception of the number of impedance matches 130 coupled to each chamber 140. For example, each chamber 140 in FIG. 1C is coupled to a pair of impedance matches 140. For example, chamber 140A is coupled to impedance match 130A1 and impedance match 130A2, and chamber 140B is coupled to impedance match 130B1 and impedance match 130B2.

Accordingly, a number of branches in the RF power distribution system may be different than a number of chambers 140 in the tool 102. In the particular embodiment shown in FIG. 1C, the ratio of impedance matches 130 to chambers 140 is 2:1. Though, other ratios may also be used in some embodiments. In the illustrated embodiment, the chambers 140 are shown as batch 142 processing chambers 140, similar to those shown in FIG. 1B. In other embodiments, multiple impedance matches 130 per chamber 140 may also be used for chambers 140 for single substrate 141 processing, similar to those shown in FIG. 1A.

Figure 2:
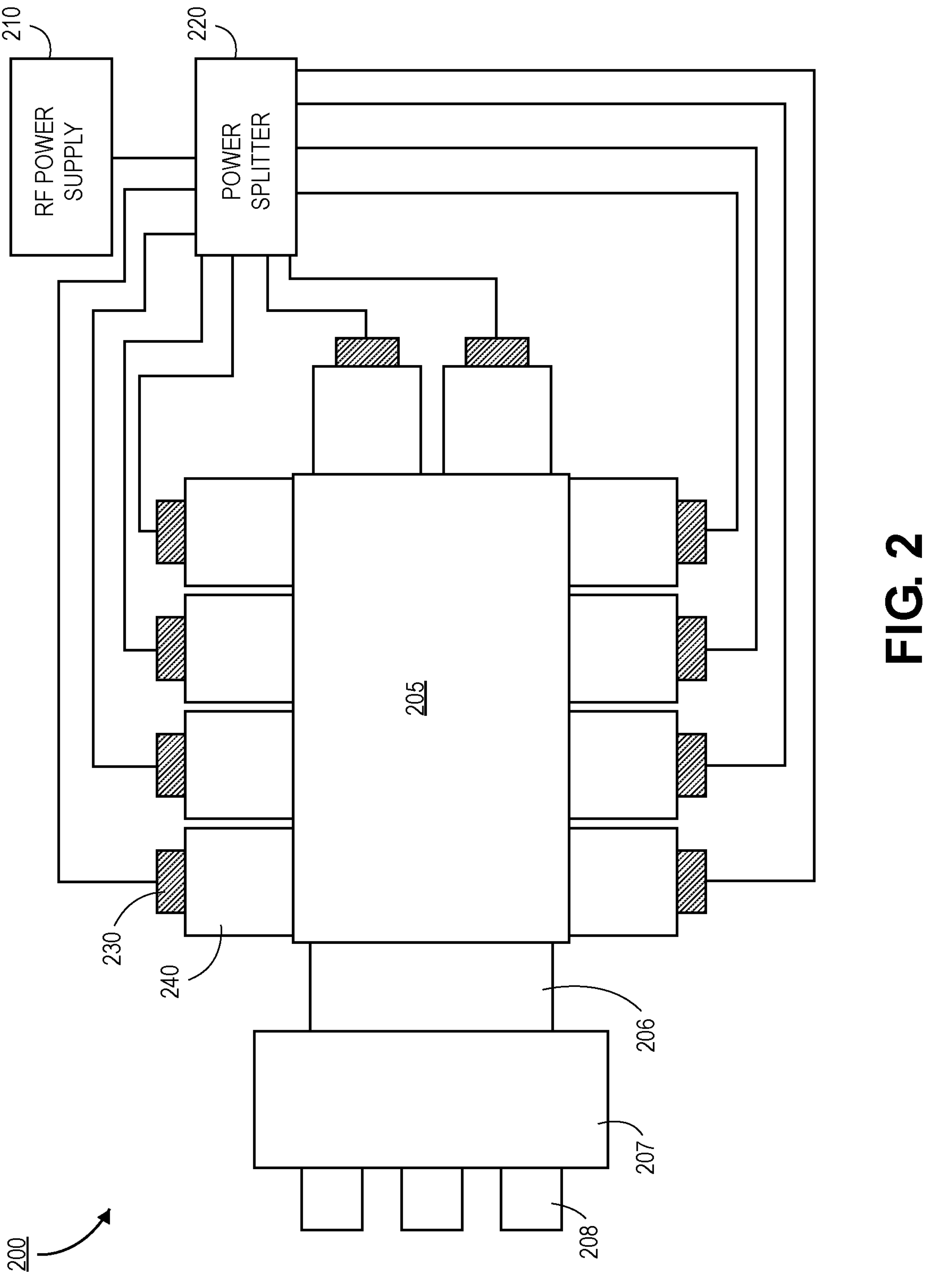
FIG. 2 is a plan view illustration of an RF plasma processing tool with an RF power distribution system that comprises a splitter and a plurality of matches downstream of the splitter, in accordance with an embodiment.

Referring now to FIG. 2, a plan view illustration of a platform tool 200 is shown, in accordance with an embodiment. The platform tool 200 may be a semiconductor processing tool such as a PEALD tool, PECVD tool, a PVD tool, a plasma etching tool, a plasma treatment tool, or the like. In an embodiment, the cluster tool may comprise an equipment front end module (EFEM) 207. The EFEM 207 may receive front opening unified pods (FOUPs) 208 or other wafer transport devices. A wafer handling robot within the EFEM 207 transfers wafers from the FOUP 208 to a load lock 206. The load lock 206 is coupled to a transfer chamber 205 that is held at a vacuum pressure. That is, the load lock 206 allows for the transition from an atmospheric pressure environment to a vacuum environment. A wafer handling robot within the transfer chamber 205 can distribute wafers from the load lock 206 to any of the chambers 240 that are coupled to the transfer chamber 205. For example, ten chambers 240 are shown in FIG. 2. Though, two or more chambers 240 may be used in some embodiments. The chambers 240 may be similar to any of the chambers described in greater detail herein.

In an embodiment, each of the chambers 240 may be supplied RF power by an RF power distribution system. The RF power distribution system may comprise an RF generator 210. While a single RF generator 210 is shown in FIG. 2, it is to be appreciated that multiple RF generators 210 may be included in the RF power distribution system in order to implement scaling, as described in greater detail herein. In an embodiment, a power splitter 220 is electrically coupled to the RF generator 210. In an embodiment, the RF splitter 220 may be a high isolation power splitter 220 or a low isolation power splitter 220.

In an embodiment, the power splitter 220 may split RF power from the RF generator 210 into a plurality of branches. In an embodiment, each branch is coupled to one of the chambers 240. For example, in FIG. 2 the chambers 240 and the branches are provided in a one-to-one ratio. Though, chambers 240 may be coupled to more than one branch of the RF power distribution system in other embodiments.

In an embodiment, an impedance match 230 may be provided along each branch of the RF power distribution system. The impedance matches 230 may be variable matches that can be configured to alter their impedance in order to account for changing plasma load impedances within the chambers 240. While the impedance matches 230 may provide variable impedances, the portion of the power distribution system upstream of the power splitter 220 is a fixed impedance system. As described above, the use of a fixed impedance system allows for improved voltage and current handling and reduced complexity in the system.

Figure 3B:
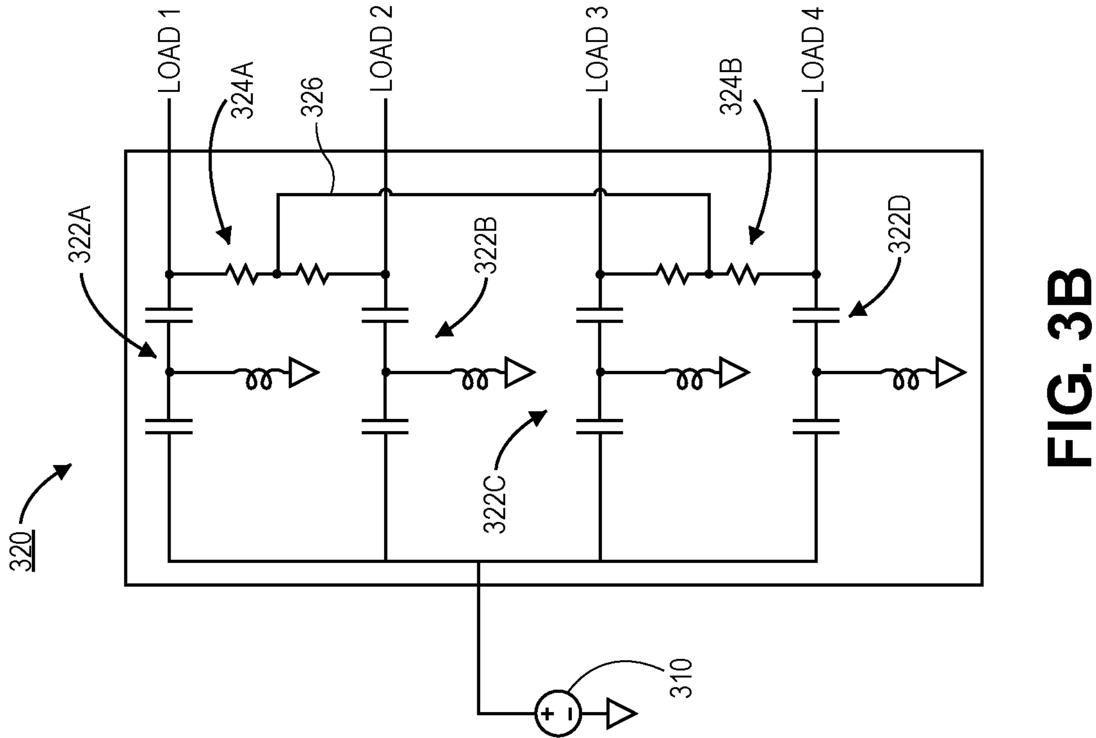
FIG. 3B is a circuit diagram of an RF power splitter with improved isolation, in accordance with an embodiment.
Figure 3A:
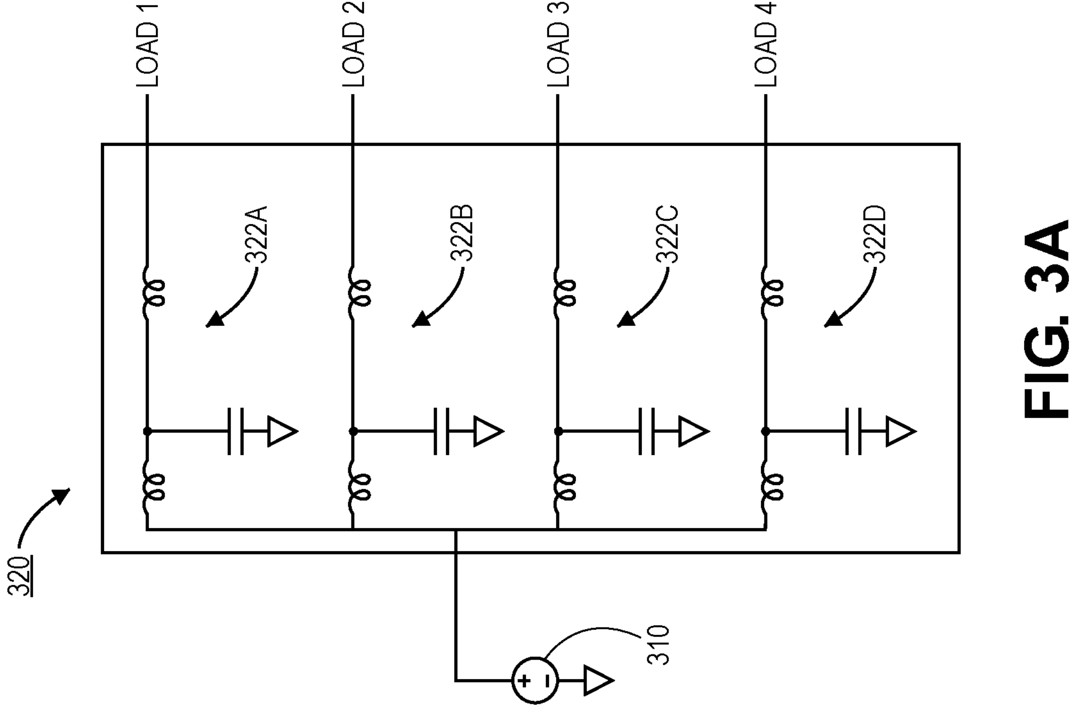
FIG. 3A is a circuit diagram of an RF power splitter, in accordance with an embodiment.

Referring now to FIGS. 3A and 3B, examples of circuit diagrams for power splitters 320 that can be used in the RF power distribution system are shown, in accordance with an embodiment. While two specific examples are shown in FIGS. 3A and 3B, it is to be appreciated that any suitable circuit capable of splitting RF power into two or more branches may be used, in accordance with various embodiments. In the particular embodiments shown in FIGS. 3A and 3B, the power splitters 320 are examples of power splitters. The power splitter 320 in FIG. 3A represents an example of a low isolation power splitter 320, and the power splitter 320 in FIG. 3B represents an example of a high isolation power splitter 320. More generally, the high isolation power splitter 320 will provide a greater extend of isolation between the branches compared to the low isolation power splitter 320.

Referring now to FIG. 3A, the power splitter 320 is fed RF power from an RF generator 310. The RF power is then split along a plurality of lines 322 within the power splitter 320 (e.g., one line for each branch that will be used in the RF power distribution system). For example, four lines 322A-322D are shown in the illustrated embodiment. However, embodiments may include two or more lines 322. In an example, each line 322 includes substantially similar passive components (e.g., capacitors, inductors, and transmission lines). In the illustrated embodiment, the main path of the line 322 comprises a series of passive elements such as an inductor, while an arm extending off the main path (in a tee configuration) may comprise a capacitor that is grounded at one terminal. In the embodiment shown, each main path exits the power splitter 320 towards a branch (e.g., Branches 1-4). Each branch may comprise an impedance match and a chamber, similar to those described in greater detail herein.

While the low isolation power splitter 320 in FIG. 3A may not be optimized to provide the highest level of isolation between the branches, such a power splitter 320 may have the benefit of lower complexity and fewer components. This can reduce the overall cost of the power splitter 320. Additionally, such a power splitter 320 may also provide the benefit of lowering RF stress within the RF power distribution system.

Referring now to FIG. 3B, a circuit diagram of a high isolation power splitter 320 is shown, in accordance with an additional embodiment. The high isolation power splitter 320 may also be fed RF power from an RF generator 310. Similar to the embodiment in FIG. 3A, the power splitter 320 may comprise a plurality of lines 322 (e.g., two or more lines 322). For example, lines 322A-322D are shown in FIG. 3B.

In an embodiment, each line 322 may comprise passive components on a main path and one or more arms. In FIG. 3B, a single arm is shown, but it is to be appreciated that two or more arms may be used in some embodiments. In an embodiment, the one or more arms may be provided between passive elements on the line 322. For example, In FIG. 3B, the arms are provided between capacitors. Though, it is to be appreciated that the arms may be provided at any suitable location along the line 322. In an embodiment, the arm may comprise one or more passive elements such as an inductor or a capacitor, with the inductor being connected to a ground in the shown embodiment. In the embodiment shown, each main path exits the power splitter 320 towards a branch (e.g., Branches 1-4). Each branch may comprise an impedance match and a chamber, similar to those described in greater detail herein.

Additionally, pairs of the main lines may be electrically coupled together by a bridge 324. For example, bridge 324A couples the line 322A to the line 322B, and the bridge 324B couples the line 322C to the line 322D. Each bridge 324 may comprise one or more resistors. In an embodiment, the bridge 324A may be electrically coupled to the bridge 324B by a common node 326. In some instances, the power splitter 320 may also comprise a delta variant high isolation splitter architecture.

In an embodiment, the use of a high isolation power splitter 320 provides the benefit of decreasing the cross-talk between branches. This makes the control of the RF power distribution system easier from a controls perspective. However, the additional components and complexity may increase the cost of the high isolation power splitter 320 compared to the low isolation power splitter 320.

In FIGS. 3A and 3B, each line 322 is considered as being identical to each other. However, in other embodiments the lines 322 may allow for different percentages of the RF power to flow to each branch. For example, changes to one or more of the component values, such as capacitance values or inductance values, may be used to alter the percentage of RF power flowing to each branch. Additionally, while fixed power splitters 320 are shown, other embodiments may include variable power splitters 320 that can be operated to change the percentage of power flown into each branch (e.g., by using variable components).

Figures 4A, 4B, 4C:
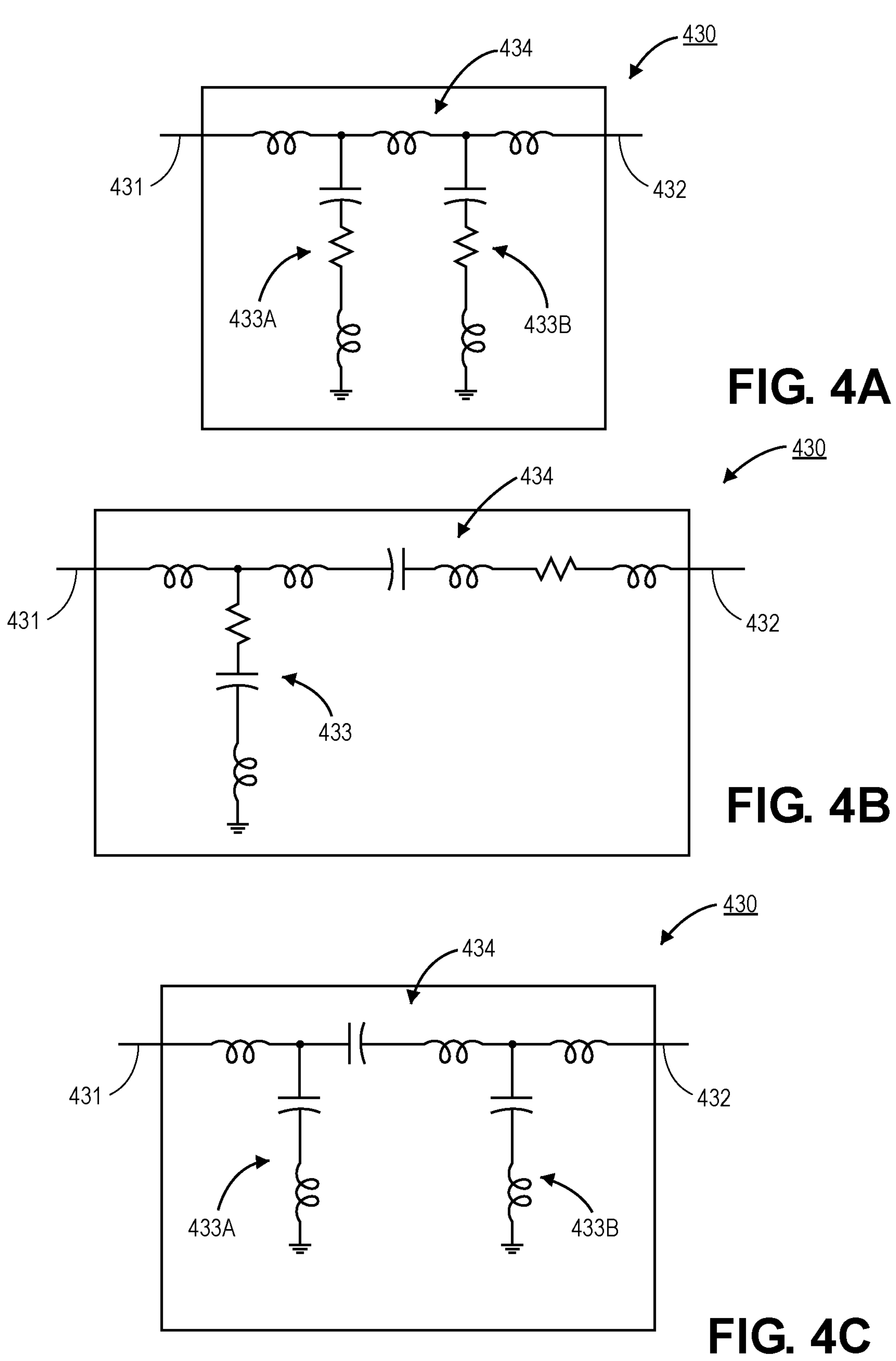
FIG. 4A is a circuit diagram of a pi network match that can be used in an RF power distribution system that comprises a splitter and a plurality of matches downstream of the splitter, in accordance with an embodiment.
FIG. 4B is a circuit diagram of an inverted L network match that can be used in an RF power distribution system that comprises a splitter and a plurality of matches downstream of the splitter, in accordance with an embodiment.
FIG. 4C is a circuit diagram of a two stage L network match that can be used in an RF power distribution system that comprises a splitter and a plurality of matches downstream of the splitter, in accordance with an embodiment.

Referring now to FIGS. 4A-4C, some examples of impedance matches 430 that may be used in the RF power distribution system are shown, in accordance with an embodiment. FIG. 4A illustrates a pi network match, FIG. 4B illustrates an inverted L network match, and FIG. 4C illustrates a multi-stage L network match. While three types of impedance matches 430 are shown as suitable architectures, other types of matches may also be used. For example, an L network match, a multi-stage inverted L network match, or the like may also be used in some embodiments.

Referring now to FIG. 4A, a circuit diagram of an impedance match 430 with a pi network is shown, in accordance with an embodiment. The impedance match 430 may comprise a main line 434 and a pair of arms 433A and 433B. The main line 434 may comprise a series of inductors, and the arms 433A and 433B may each comprise passive elements such as a capacitor or an inductor that are coupled to a ground. In an embodiment, an input 431 of the impedance match 430 is fed RF power from a power splitter (not shown), and the output 432 provides RF power to a chamber (not shown). Further, in some embodiments, the match stages may be separated by transmission lines (not shown) or at least partially comprised of transmission lines.

Referring now to FIG. 4B, a circuit diagram of an impedance match 430 with an inverted L network is shown, in accordance with an embodiment. The impedance match 430 may comprise a main line 434 and an arm 433. The main line 434 may comprise a set passive elements such as inductors, capacitors, and resistors, and the arm 433 may comprise of passive elements such as a capacitor or an inductor that are coupled to a ground. In an embodiment, an input 431 of the impedance match 430 is fed RF power from a power splitter (not shown), and the output 432 provides RF power to a chamber (not shown).

Referring now to FIG. 4C, a circuit diagram of an impedance match 430 with a two stage L network is shown, in accordance with an embodiment. The impedance match 430 may comprise a main line 434 and a pair of arms 433A and 433B. The main line 434 may comprise a set of inductors with a capacitor, and the arms 433A and 433B may each comprise a capacitor and an inductor that are coupled to a ground. In an embodiment, an input 431 of the impedance match 430 is fed RF power from a power splitter (not shown), and the output 432 provides RF power to a chamber (not shown).

Figure 5:
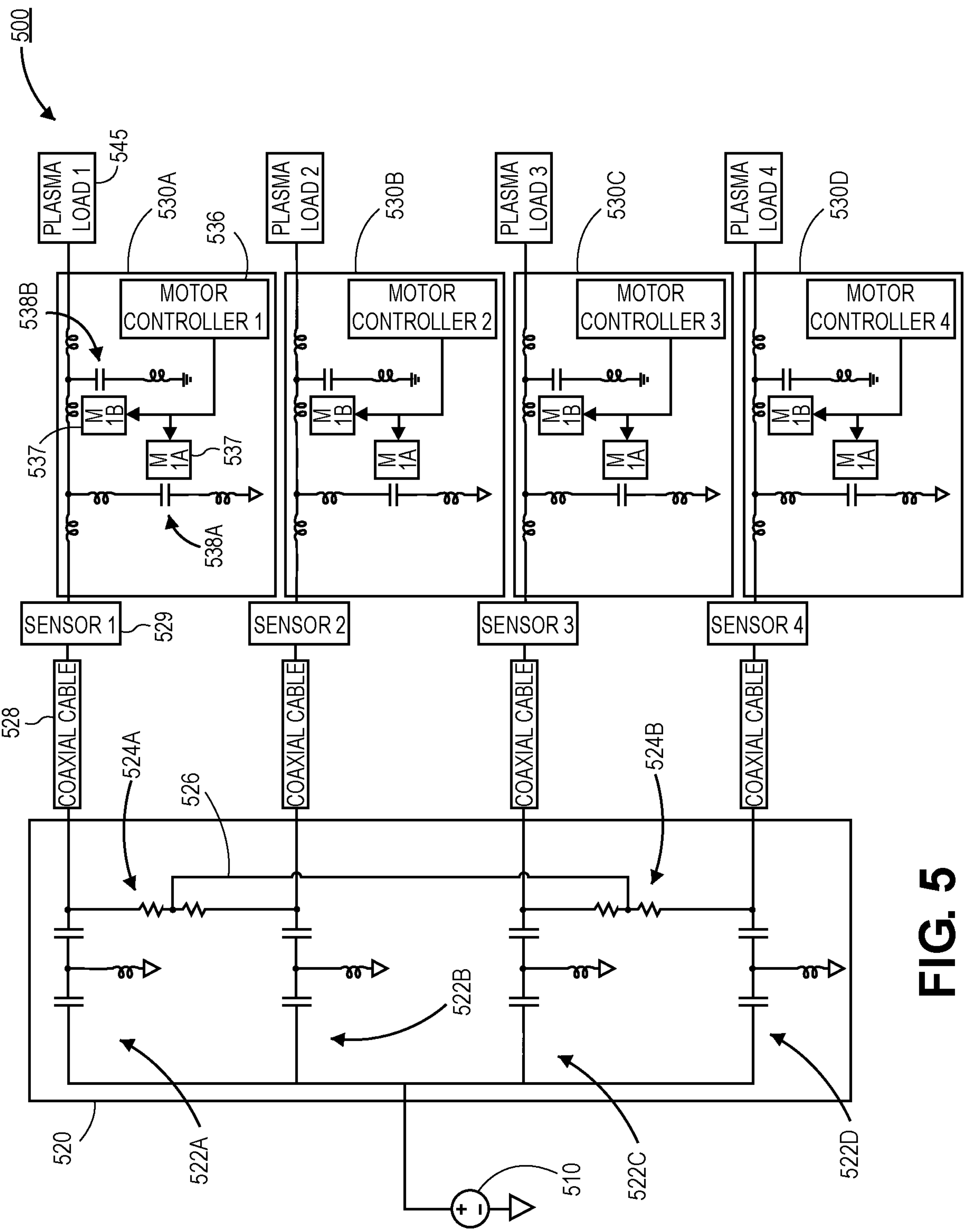
FIG. 5 is a circuit diagram of an RF plasma processing tool that comprises a splitter and a plurality of impedance matches between the splitter and their respective chambers, in accordance with an embodiment.

Referring now to FIG. 5, a schematic illustration of an RF plasma processing tool 500 is shown, in accordance with an embodiment. In an embodiment, the RF plasma processing tool 500 may be similar to any of the RF plasma processing tools described in greater detail herein. For example, the RF plasma processing tool 500 may comprises an RF power distribution system with an RF generator 510 that feeds RF power to a power splitter 520. The power splitter 520 may split the RF power into a plurality of branches, with each branch comprising an impedance match 530 and a plasma load 545 (e.g., a plasma within a chamber (not shown)). For example, four branches with impedance matches 530A-530D with respective plasma loads (1-4) 545 are shown in FIG. 5.

In an embodiment, the power splitter 520 may be high isolation power splitter 520. Though, any power splitter 520 described herein may be used in accordance with an embodiment. For example, the power splitter 520 may comprise a plurality of lines 522A-522D with bridge 524A between lines 522A and 522B and bridge 524B between lines 522C and 522D. In an embodiment, a common node 526 electrically couples the bridge 524A to the bridge 524B.

In an embodiment, coaxial cables 528 may be used to couple the power splitter 520 to the plurality of impedance matches 530. Additionally, a sensor 529 (e.g., Sensors 1-4) may be provided along each branch between the power splitter 520 and the impedance match 530. The sensor 529 may be a reflected power sensor or any other sensor suitable for detecting impedance mismatches along the branch. The sensor 529 may send signals relating to impedance mismatches (e.g., reflected power percentages) to an RF power distribution system controller (not shown in FIG. 5).

In an embodiment, the impedance matches 530A-530D may have any suitable impedance matching network, such as those described in greater detail herein. In a particular embodiment, the impedance matches 530 are variable in that one or more passive components 538 are controllable by one or more motors 537 in order to change an impedance of the impedance match 530. For example, in impedance match 530A, motor (M1A) 537 controls passive component 538A and motor (M1B) 537 controls passive component 538B. The motors 537 may be driven by a motor controller 536. The motor controller 536 is communicatively coupled to an RF power distribution system controller (not shown in FIG. 5).

Figure 6:
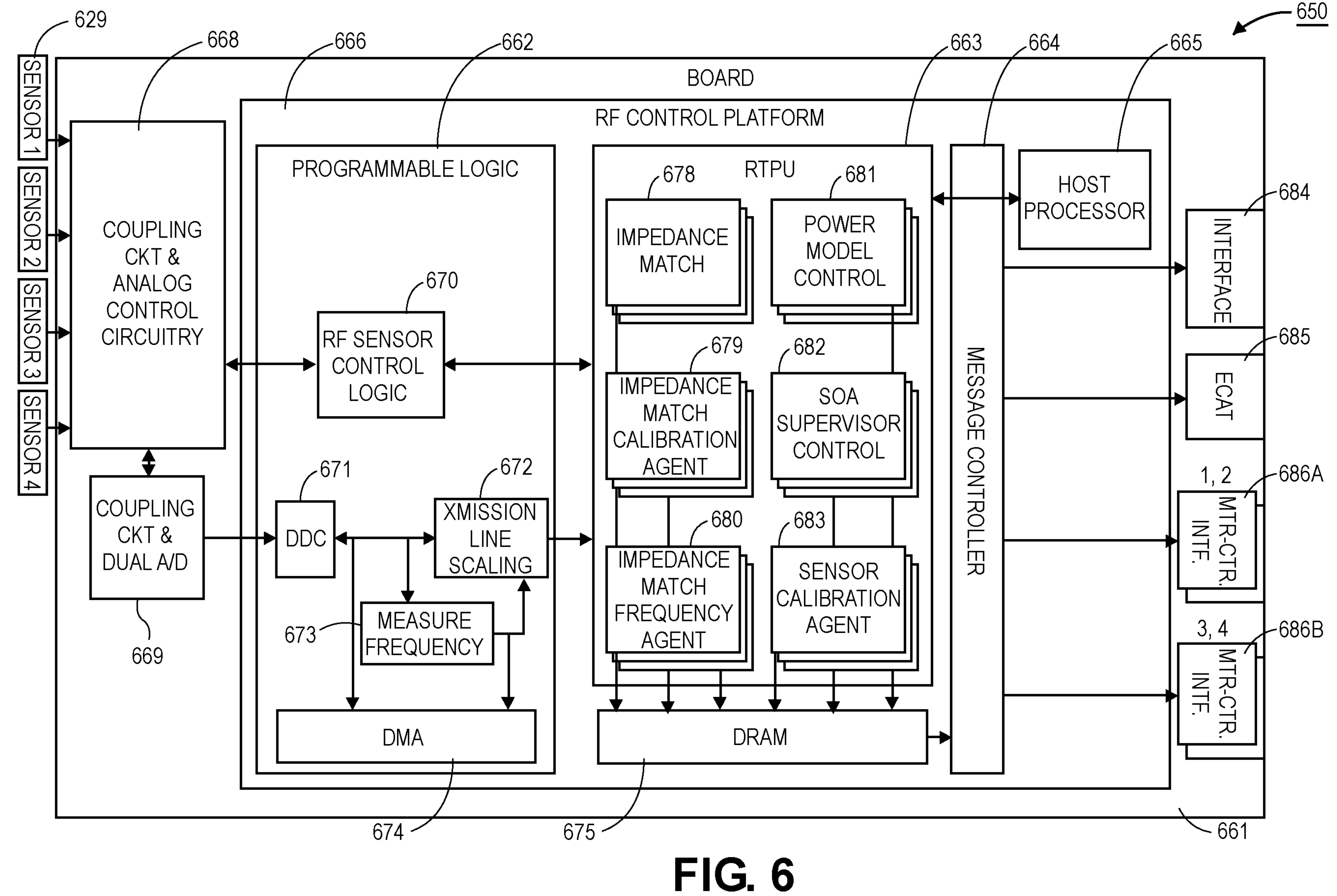
FIG. 6 is a block diagram of a controller for operating an RF power distribution system that comprises a splitter and a plurality of matches downstream of the splitter, in accordance with an embodiment.

Referring now to FIG. 6, a block diagram of an RF power distribution system controller 650 is shown, in accordance with an embodiment. The controller 650 may include a board 661, such as a printed circuit board (PCB) assembly. In an embodiment, a coupling circuit and analog control circuitry 668 is provided on the board 661. The coupling circuit and analog control circuitry 668 receives signals from the sensors 629 that are provided in the RF power distribution system (e.g., sensors 529 in FIG. 5). The signals may represent a one or more of a percentage of reflected power along each branch, an impedance mismatch measurement, transmitted power, power transmitted to the chamber, or the like. The number of sensors 629 may be equal to a number of branches in the RF power distribution system. In an embodiment, the processed signals are passed to a programmable logic block 662 that comprises an RF sensor control logic block 670. Additionally, the processed signals are passed to a coupling circuit and dual analog/digital block 669 on the board 661. The block 669 passes the signals to a digital down conversion (DDC) block 671 and into a frequency measuring block 673, a transmission line scaling block 672, and a dynamic memory access (DMA) 674.

In an embodiment, the RF sensor control logic block 670 and the transmission line scaling block 672 may provide signals to a real time processing unit (RTPU) 663. In an embodiment, the RTPU 663 may comprise a plurality of different processing blocks 678-683 for determining how to modify the impedance matches in order to reduce or eliminate reflected power in the RF power distribution system. In the illustration, each block 678-683 comprises multiple instances (e.g., three instances are shown). More generally, the number of instances of each block 678-683 may be equal to the number of branches in the RF power distribution system.

In an embodiment, block 678 may be an impedance match block configured to monitor the settings of the various impedance matches (not shown) in the RF power distribution system. The block 679 may be an impedance match calibration agent used to calibrate the individual impedance matches. Block 680 may be an impedance match frequency agent that is used to monitor and/or control a frequency within each impedance match. The power model control 681 may be used to control a model of the power that passes through the RF power distribution system. The safe operating area (SOA) supervisor control 682 may include a set of parameters that limit the operation of the RF plasma processing tool outside of the SOA. This can be used in order to protect the RF power distribution system from damage due to excessive reflected power and/or operating outside of set safety limits. The sensor calibration agent 683 may be used to implement calibration of the plurality of sensors 629. In an embodiment, each of the blocks 678-683 may be electrically coupled to a memory 675, such as a DRAM. In an embodiment, the RTPU may also be electrically coupled to a host processor 665 that provides high level control of the controller 650.

In an embodiment, the memory 675 may be electrically coupled to a message controller 664. The message controller 664 may be a component that manages the flow of data between blocks and/or systems within the controller 650. For example, the message controller 664 may provide data to an interface 684 (e.g., an ENET interface, a USB interface, etc.), an ECAT module 685, and motor controller interfaces 686. In an embodiment, the motor controller interfaces 686 may be communicatively coupled to the motor controllers 536 (shown in FIG. 5) of the impedance match. The number of motor controller interfaces 686 may match the number of impedance matches in the RF power distribution system. For example, motor controller interfaces 686A include a pair of motor controllers (1, 2), and motor controller interfaces 686B include a pair of motor controllers (3, 4). However, each motor controller interface may be responsible for communicating with one or more motor controllers 536. That is, each motor controller interface 686 is not restricted to controlling a single match. That is, the RF power distribution system controller 650 may receive data from the sensors 629, process that data to determine how the impedance matches need to be adjusted to reduce reflected power, and use the motor controllers 686 to initiate a change in the impedance matches.

In an embodiment, the programmable logic 662, the RTPU 663, the message controller 664, and the host processor 665 may be integrated within a larger RF control platform 666 that is provided on the board 661. The RF control platform 666 may be implemented on its own board that is mounted to the board 661 in some embodiments.

In an embodiment, the RF power distribution system controller 650 provides multiple benefits when used in conjunction with the hardware of the RF power distribution systems described in greater detail herein. For example, the controller 650 allows for improved RF power balancing along each of the branches in the RF power distribution system. In a particular embodiment, coupling circuitry and analog control circuitry 668 is configured to receive incident and reflected RF voltages and RF current signals from a plurality of sensors 629. This information can then be processed through one or more different modules and/or blocks within the controller 650 in order to output a control effort that is sent to the impedance matches by the motor controller interfaces 686.

Different blocks are described with respect to the controller 650. The individual blocks may be implemented through hardware (e.g., circuitry), software, firmware, or any combination of the three. Connections between blocks (indicated by arrows) may represent electrical interconnects (e.g., comprising one or more of electrically conductive traces, vias, or pads) that are provide on the board 661 of any other board or package used to assemble the controller 650.

Figure 7:
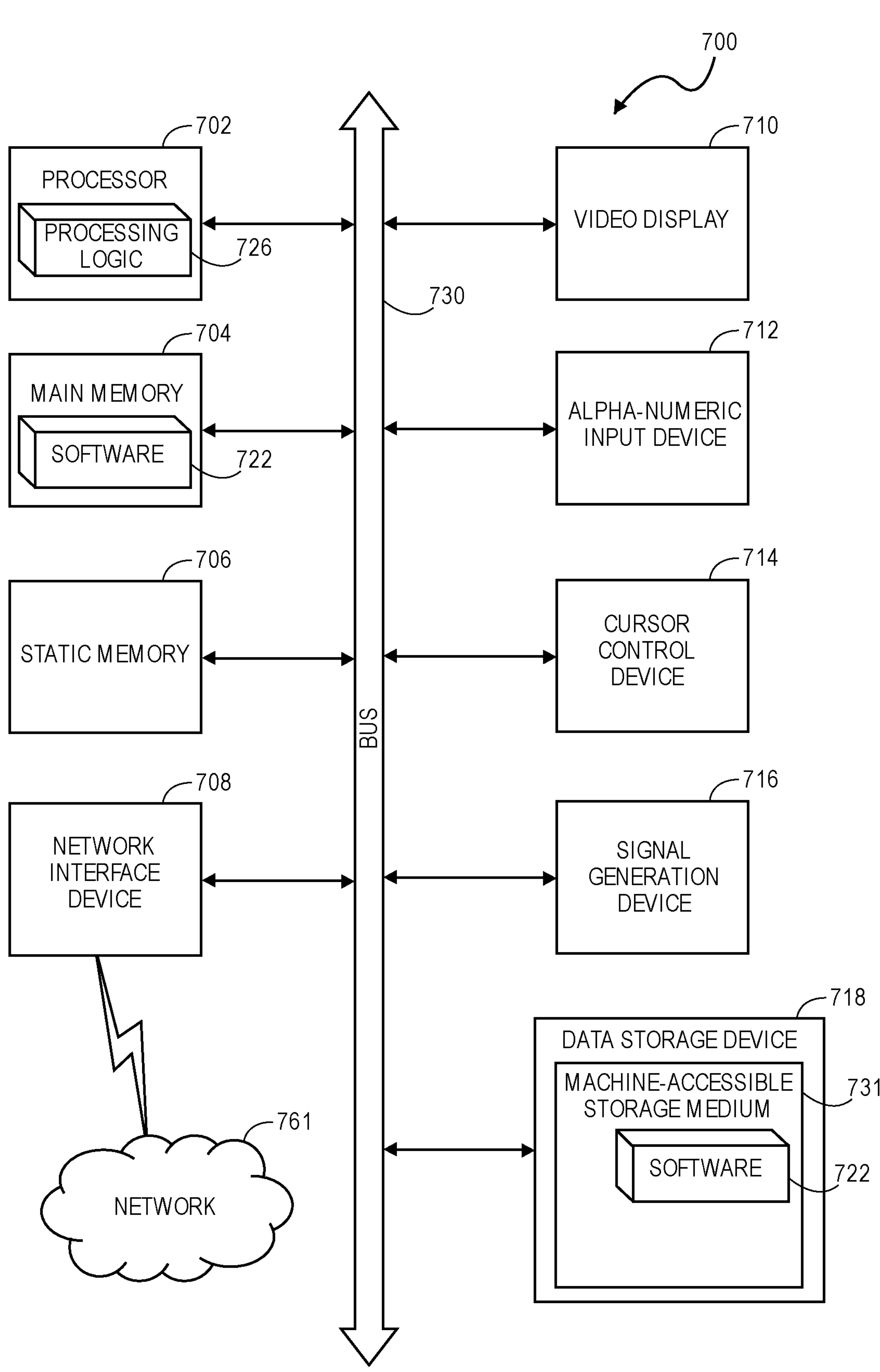
FIG. 7 illustrates a block diagram of an exemplary computer system that may be used in conjunction with a processing tool, in accordance with an embodiment.

Referring now to FIG. 7, a block diagram of an exemplary computer system 700 of a processing tool is illustrated in accordance with an embodiment. In an embodiment, computer system 700 is coupled to and controls processing in the processing tool. Computer system 700 may be connected (e.g., networked) to other machines in a Local Area Network (LAN), an intranet, an extranet, or the Internet. Computer system 700 may operate in the capacity of a server or a client machine in a client-server network environment, or as a peer machine in a peer-to-peer (or distributed) network environment. Computer system 700 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 700, the term "machine" shall also be taken to include any collection of machines (e.g., computers) that individually or jointly execute a set (or multiple sets) of instructions to perform any one or more of the methodologies described herein. In other embodiments, the term "machine" may also cover a state machine that may not have an explicit instruction set.

Computer system 700 may include a computer program product, or software 722, having a non-transitory machine-readable medium having stored thereon instructions, which may be used to program computer system 700 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 700 includes a system processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 730.

System processor 702 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, system processors implementing a combination of instruction sets, or a state machine that may not have an explicit instruction set. System processor 702 may also be one or more special-purpose processing devices such as an application specific integrated circuit (ASIC), a field programmable gate array (FPGA), a digital signal system processor (DSP), network system processor, or the like. System processor 702 is configured to execute the processing logic 726 for performing the operations described herein.

The computer system 700 may further include a system network interface device 708 for communicating with other devices or machines. The computer system 700 may also include a video display unit 710 (e.g., a liquid crystal display (LCD), a light emitting diode display (LED), or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium 731 (or more specifically a computer-readable storage medium) on which is stored one or more sets of instructions (e.g., software 722) embodying any one or more of the methodologies or functions described herein. The software 722 may also reside, completely or at least partially, within the main memory 704 and/or within the system processor 702 during execution thereof by the computer system 700, the main memory 704 and the system processor 702 also constituting machine-readable storage media. The software 722 may also be directly implemented as hardware gates in some embodiments. The software 722 may further be transmitted or received over a network 761 via the system network interface device 708. In an embodiment, the network interface device 708 may operate using RF coupling, optical coupling, acoustic coupling, or inductive coupling.

While the machine-accessible storage medium 731 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. An apparatus, comprising:
- a radio frequency (RF) power supply;
- a power splitter electrically coupled to the RF power supply;
- a plurality of impedance matches electrically coupled between the power splitter, and a plurality of chambers; wherein the power splitter is intervening between the RF power supply and the plurality of impedance matches and is configured to split RF power from the RF power supply in order to supply the RF power to each of the plurality of impedance matches; and
- wherein each chamber is electrically coupled to a different one of the plurality of impedance matches.

2. The apparatus of claim 1, wherein a number of the plurality of chambers is equal to a number of the plurality of impedance matches.

3. The apparatus of claim 1, wherein a number of the plurality of impedance matches is greater than a number of the plurality of chambers.

4. The apparatus of claim 1, wherein at least one of the plurality of chambers is configured to process a plurality of substrates in a batch process.

5. The apparatus of claim 1, wherein the power splitter is a high isolation power splitter.

6. The apparatus of claim 1, wherein the power splitter is a low isolation power splitter.

7. The apparatus of claim 1, wherein the plurality of impedance matches comprise a pi network match, an L network match, an inverted L network match, or a two stage L network match.

8. The apparatus of claim 1, wherein each of the plurality of impedance matches is independently controllable.

9. The apparatus of claim 1, further comprising: a plurality of reflected power sensors, wherein each of the plurality of reflected power sensors is electrically coupled between the power splitter and a different one of the plurality of impedance matches.

10. The apparatus of claim 1, further comprising: a process controller communicatively coupled to the plurality of impedance matches configured to control impedances of each of the plurality of impedance matches.

11. An apparatus, comprising:
- a radio frequency (RF) power generator;
- a power splitter coupled to the RF power generator; a plurality of impedance matches, wherein each of the plurality of impedance matches are electrically coupled to each of a plurality of chambers, and wherein the power splitter is intervening between the RF power generator and the plurality of impedance matches and is configured to split RF power from the RF power generator to supply RF power to each of the plurality of impedance matches, and wherein each of the plurality of impedance matches comprises an actuator configured to alter an impedance of a respective impedance match;
- a plurality of reflected power sensors, wherein each of the plurality of reflected power sensors is electrically coupled between the power splitter and a different one of the plurality of impedance matches; and a controller, wherein the controller is configured to receive an input signal from each of the plurality of reflected power sensors and use the input signal to drive the actuators in order to alter the impedance of the respective impedance match.

12. The apparatus of claim 11, wherein each of the plurality of impedance matches comprises two actuators.

13. The apparatus of claim 11, wherein the controller comprises a real time processing unit (RTPU).

14. The apparatus of claim 13, wherein the RTPU comprises one or more of: an impedance match module, an impedance match calibration agent, and an impedance match frequency agent.

15. The apparatus of claim 13, wherein the RTPU comprises a safe operating area (SOA) supervisor control.

16. The apparatus of claim 11, wherein the plurality of impedance matches comprise a pi network match, an L network match, an inverted L network match, a multi-stage L network match, or a multi-stage inverted L network match.

17. The apparatus of claim 11, wherein the power splitter is a high isolation power splitter.

18. An apparatus for controlling a plurality of impedance matches which are electrically coupled between a power splitter, and a plurality of chambers, wherein the power splitter is intervening between an Radio Frequency (RF) power supply and the plurality of impedance matches, the apparatus comprising:

coupling circuitry and analog control circuitry configured to receive incident and reflected RF voltages and RF current signals from a plurality of sensors; an RF control platform, wherein the RF control platform comprises:

programmable logic;

a real time processing unit (RTPU);

a message controller; and a processor; and a plurality of motor control interfaces, wherein the plurality of motor control interfaces are configured to control impedances of the plurality of impedance matches.

19. The apparatus of claim 18, wherein the RTPU comprises one or more of: an impedance match module, an impedance match calibration agent, and an impedance match frequency agent, a safe operating area (SOA) supervisor control, a power model control, or a sensor calibration agent.

20. The apparatus of claim 18, wherein the apparatus is configured to provide impedance tuning and/or RF power balancing.

* * * * *